US010978540B2

(12) United States Patent
Lee et al.

(10) Patent No.: US 10,978,540 B2
(45) Date of Patent: Apr. 13, 2021

(54) METHOD OF MANUFACTURING ORGANIC LIGHT-EMITTING DISPLAY APPARATUS INCLUDING MULTILAYER AUXILIARY ELECTRODE

(71) Applicant: Samsung Display Co., Ltd., Yongin (KR)

(72) Inventors: Seho Lee, Yongin (KR); Taehyung Kim, Yongin (KR); Byoungseong Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/686,063

(22) Filed: Aug. 24, 2017

(65) Prior Publication Data

US 2017/0373130 A1    Dec. 28, 2017

Related U.S. Application Data

(62) Division of application No. 14/793,302, filed on Jul. 7, 2015, now Pat. No. 9,780,158.

(30) Foreign Application Priority Data

Dec. 2, 2014    (KR) .................... 10-2014-0170834

(51) Int. Cl.
*H01L 27/32*    (2006.01)
*H01L 51/52*    (2006.01)
(Continued)

(52) U.S. Cl.
CPC ...... *H01L 27/3276* (2013.01); *H01L 27/3246* (2013.01); *H01L 51/5212* (2013.01);
(Continued)

(58) Field of Classification Search
CPC ............. H01L 51/5212; H01L 51/5228; H01L 2227/323
See application file for complete search history.

(56) References Cited

U.S. PATENT DOCUMENTS

2004/0251827 A1    12/2004    Kang et al.
2005/0270259 A1*   12/2005    Shirasaki ............ H01L 27/3279
                                                           345/76
(Continued)

FOREIGN PATENT DOCUMENTS

JP      2007-052966     3/2007
KR      10-2000-0065703   11/2000
(Continued)

OTHER PUBLICATIONS

Extended European Search Report dated May 6, 2016, in European Patent Application No. 15187959.
(Continued)

*Primary Examiner* — Eduardo A Rodela
*Assistant Examiner* — Christopher M Roland
(74) *Attorney, Agent, or Firm* — H.C. Park & Associates, PLC (57) ABSTRACT

A method of manufacturing an organic light-emitting display apparatus includes: forming an auxiliary electrode including: a first conductive layer; and a second conductive layer disposed on the first conductive layer, the second conductive layer having a resistance higher than a resistance of the first conductive layer; forming a first intermediate layer on the auxiliary electrode; exposing the first conductive layer includes forming a first opening in the first intermediate layer and an opening portion in the second conductive layer by removing a portion of the first intermediate layer and a portion of the second conductive layer of the auxiliary electrode; and forming an opposite electrode on the first intermediate layer and the first conductive layer, (Continued)

wherein the opposite electrode is disposed contacting the first conductive layer exposed through the first opening of the first intermediate layer and the opening portion of the second conductive layer.

11 Claims, 7 Drawing Sheets

(51) Int. Cl.
*H01L 51/56* (2006.01)
*H01L 51/00* (2006.01)

(52) U.S. Cl.
CPC .......... *H01L 51/5228* (2013.01); *H01L 51/56* (2013.01); *H01L 51/0009* (2013.01); *H01L 51/0077* (2013.01); *H01L 2227/323* (2013.01)

(56) References Cited

U.S. PATENT DOCUMENTS

| | | | |
|---|---|---|---|
| 2007/0080356 A1 | 4/2007 | Nakayama et al. | |
| 2008/0284323 A1 | 11/2008 | Kashiwabara et al. | |
| 2009/0256168 A1* | 10/2009 | Taneda | H01L 27/3246 257/98 |
| 2009/0309493 A1 | 12/2009 | Seo | |
| 2010/0244664 A1 | 9/2010 | Fujioka et al. | |
| 2011/0140113 A1* | 6/2011 | Park | H01L 27/1214 257/59 |
| 2011/0216278 A1* | 9/2011 | Nagano | G02F 1/1333 349/138 |
| 2012/0268002 A1* | 10/2012 | Osako | H01L 27/3258 313/504 |
| 2013/0105801 A1* | 5/2013 | Lee | H01L 21/268 257/59 |
| 2014/0239262 A1 | 8/2014 | Kim et al. | |
| 2014/0346459 A1 | 11/2014 | Song et al. | |
| 2014/0354142 A1 | 12/2014 | Jeong et al. | |
| 2014/0367651 A1* | 12/2014 | Song | H01L 51/5228 257/40 |
| 2014/0374732 A1 | 12/2014 | Jeong et al. | |
| 2015/0014658 A1* | 1/2015 | Choung | H01L 51/5203 257/40 |
| 2015/0090989 A1* | 4/2015 | Matsumoto | H01L 51/56 257/40 |
| 2016/0013438 A1 | 1/2016 | Im et al. | |
| 2016/0035813 A1* | 2/2016 | Lee | H01L 27/3276 257/40 |
| 2016/0043341 A1* | 2/2016 | Heo | H01L 51/5228 257/40 |
| 2016/0071914 A1* | 3/2016 | Lee | H01L 27/3246 257/40 |
| 2016/0093680 A1* | 3/2016 | Paek | H01L 51/5203 257/40 |
| 2016/0190505 A1* | 6/2016 | Koo | H01L 51/5228 257/40 |
| 2017/0200776 A1* | 7/2017 | Park | H01L 51/5228 |

FOREIGN PATENT DOCUMENTS

| | | |
|---|---|---|
| KR | 10-2004-0106058 | 12/2004 |
| KR | 10-2005-0027464 | 3/2005 |
| KR | 10-2014-0106049 | 9/2014 |

OTHER PUBLICATIONS

Non Final Office Action dated Jan. 12, 2017, issued in U.S. Appl. No. 14/793,302.

Notice of Allowance dated Jun. 28, 2017, issued in U.S. Appl. No. 14/793,302.

* cited by examiner

METHOD OF MANUFACTURING ORGANIC LIGHT-EMITTING DISPLAY APPARATUS INCLUDING MULTILAYER AUXILIARY ELECTRODE

RELATED APPLICATIONS

This application is a divisional of U.S. patent application Ser. No. 14/793,302, filed on Jul. 7, 2015, which claims priority from and the benefit of Korean Patent Application No. 10-2014-0170834, filed on Dec. 2, 2014, which is hereby incorporated by reference for all purposes as if fully set forth herein.

BACKGROUND

Field

One or more exemplary embodiments relate to an organic light-emitting display apparatus and a method of manufacturing the organic light-emitting display apparatus, and more particularly, to an organic light-emitting display apparatus which is easy to manufacture and has is excellent light-emitting stability, and a method of manufacturing the organic light-emitting display apparatus.

Discussion of the Background

In an organic light-emitting display apparatus, each pixel includes an organic light-emitting device. The organic light-emitting device includes a pixel electrode, an opposite electrode facing the pixel electrode, and an intermediate layer interposed between the pixel electrode and the opposite electrode and including an emission layer. According to the above structure, the pixel electrode is in the form of an island patterned for each pixel, and the opposite electrode may be in a form that is integrated with respect to a plurality of pixels.

However, such an integrated form of the opposite electrode may cause an IR drop in the opposite electrode with respect to the pixels. Accordingly, unintended deviations in brightness may be generated in the pixels.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide the present inventive concept include an organic light-emitting display apparatus which is easy to manufacture and has excellent light-emitting stability, and a method of manufacturing the organic light-emitting display apparatus.

Additional aspects will be set forth in the detailed description which follows, and, in part, will be apparent from the disclosure, or may be learned by practice of the inventive concept.

According to one or more exemplary embodiments, an organic light-emitting display apparatus includes an auxiliary electrode including: a first conductive layer; and a second conductive layer disposed on the first conductive layer, the second conductive layer having a resistance higher than a resistance of the first conductive layer, wherein the second conductive layer includes an opening portion exposing at least a part of the first conductive layer; a pixel electrode; a pixel definition layer disposed on the pixel electrode and the auxiliary electrode, the pixel definition layer exposing at least a part of the pixel electrode and the auxiliary electrode; a first intermediate layer disposed on the pixel electrode and the auxiliary electrode, the first intermediate layer including a first opening corresponding to the opening portion; an emission layer disposed on the first intermediate layer overlapping at least a part of the pixel electrode exposed by the pixel definition layer; and an opposite electrode disposed on the first intermediate layer and the emission layer, the opposite electrode directly contacting the first conductive layer through the first opening and the opening portion.

According to one or more exemplary embodiments, a method of manufacturing an organic light-emitting display apparatus includes: forming an auxiliary electrode including: a first conductive layer; and a second conductive layer disposed on the first conductive layer, the second conductive layer having a resistance higher than a resistance of the first conductive layer; forming a first intermediate layer on the auxiliary electrode; exposing the first conductive layer includes forming a first opening in the first intermediate layer and an opening portion in the second conductive layer by removing a portion of the first intermediate layer and a portion of the second conductive layer of the auxiliary electrode; and forming an opposite electrode on the first intermediate layer and the first conductive layer, wherein the opposite electrode is disposed contacting the first conductive layer exposed through the first opening of the first intermediate layer and the opening portion of the second conductive layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1, 2, 3, 4, 5, 6, 7A and 7B are cross-sectional views schematically illustrating processes of an exemplary method of manufacturing an organic light-emitting display apparatus, according to one or more exemplary embodiments.

Figure 1:
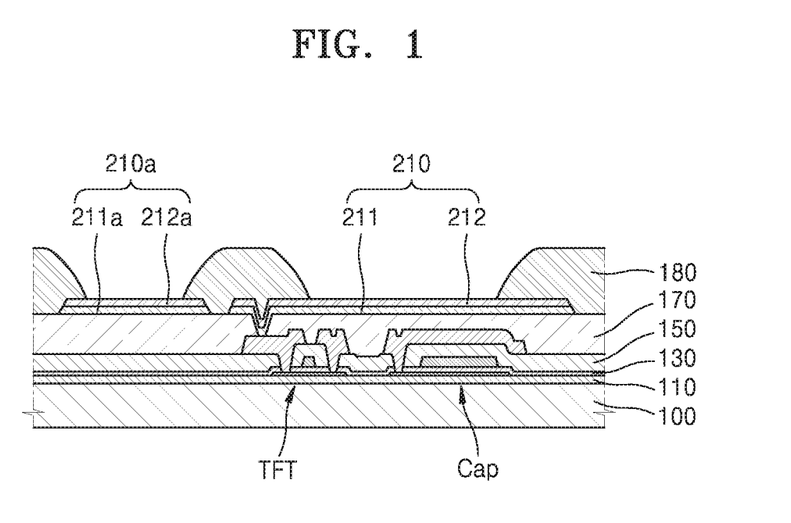
FIGS. 1, 2, 3, 4, 5, 6, 7A, and 7B are cross-sectional views schematically illustrating processes of an exemplary method of manufacturing an organic light-emitting display apparatus, according to one or more exemplary embodiments.

First, referring to FIG. 1, an auxiliary electrode 210*a* is formed. The auxiliary electrode 210*a* includes a first conductive layer 211*a* and a second conductive layer 212*a* disposed on the first conductive layer 211*a*. Resistance of the second conductive layer 212*a* may be higher than that of the first conductive layer 211*a*. For example, the first conductive layer 211*a* may include at least one of silver (Ag), Magnesium (Mg), Aluminum (Al), Platinum (Pt), Lead (Pd), Gold (Au), Nickel (Ni), Neodymium (Nd), Iridium (Ir), Chromium (Cr), and alloys thereof, and the second conductive layer 212*a* may include a light-transmissive conductive material including at least one of indium tin oxide (ITO), indium zinc oxide (IZO), zinc oxide (ZnO), indium oxide ($In_2O_3$), indium gallium oxide (IGO), and aluminum zinc oxide (AZO).

As illustrated in FIG. 1, a pixel electrode 210 may be formed in addition to the auxiliary electrode 210*a*. The pixel electrode 210 and the auxiliary electrode 210*a* may be formed on the same layer and separated from each other, thereby being electrically insulated from each other. Although FIG. 1 illustrates that the pixel electrode 210 and the auxiliary electrode 210*a* are formed on a planarization layer 170 (or a protective layer), the exemplary embodiments are not limited thereto. The pixel electrode 210 and the auxiliary electrode 210*a* may be simultaneously formed, and the pixel electrode 210 may have the same structure as the auxiliary electrode 210*a*. Thus, pixel electrode 210 may include a first electrode layer 211 including substantially the same material as that of the first conductive layer 211*a* of the auxiliary electrode 210*a*, and a second electrode layer 212 including substantially the same material as that of the second conductive layer 212*a* of the auxiliary electrode 210*a*.

As described later, the pixel electrode 210 directly contacts a first intermediate layer 221. Accordingly, a contact between the pixel electrode 210 and the first intermediate layer 221 may be an ohmic contact. To this end, a portion of the pixel electrode 210 that contacts the first intermediate layer 221 may include a light-transmissive conductive material including at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have relatively lower resistance by including, in addition to the second electrode layer 212 that includes the light-transmissive conductive material, the first electrode layer 211 disposed under the second electrode layer 212 having a resistance lower than that of the second electrode layer 212. For simplification of a manufacturing process, the auxiliary electrode 210a may be simultaneously formed on the same layer as the pixel electrode 210 having substantially the same layered structure. Accordingly, the auxiliary electrode 210a may include the first conductive layer 211a and the second conductive layer 212a.

Various layers may be formed before the pixel electrode 210 and the auxiliary electrode 210a are disposed on the substrate. In FIG. 1, a thin film transistor (TFT) and a capacitor Cap are formed on a substrate 100, the planarization layer 170 is formed thereon, and the pixel electrode 210 and the auxiliary electrode 210a are formed on the planarization layer 170.

The substrate 100 may be formed of various materials including at least one of a glass material, a metal material, and a plastic material, for example, polyethylene terephthalate (PET), polyethylene naphthalate (PEN), polyimide, etc. The organic light-emitting display apparatus may further include a buffer layer 110 configured to reduce or prevent intrusion of foreign materials into a semiconductor layer of the TFT, a gate insulating layer 130 configured to insulate the semiconductor layer and a gate electrode of the TFT, an interlayer insulating layer 150 configured to insulate source and drain electrodes and the gate electrode of the TFT, and the planarization layer 170 covering the TFT and having an upper surface that is substantially flat.

A pixel definition layer 180 may be formed to expose at least a part of the pixel electrode 210. For example, the pixel definition layer 180 may cover edges of the pixel electrode 210. The pixel definition layer 180 having openings corresponding to each pixels, exposing at least a part of the pixel electrode 210, may be configured to define each of the pixels. The pixel definition layer 180 may also increase a distance between an end portion of the pixel electrode 210 and an opposite electrode (not shown) formed later above the pixel electrode 210, and therefore, the pixel definition layer 180 may be configured to reduce or prevent generation of an arc from the end portion of the pixel electrode 210. Referring to FIG. 1, the pixel electrode 210 and the auxiliary electrode 210a are formed on the same layer, so the pixel definition layer 180 may also be formed to expose at least a part of the auxiliary electrode 210a.

Figure 2:
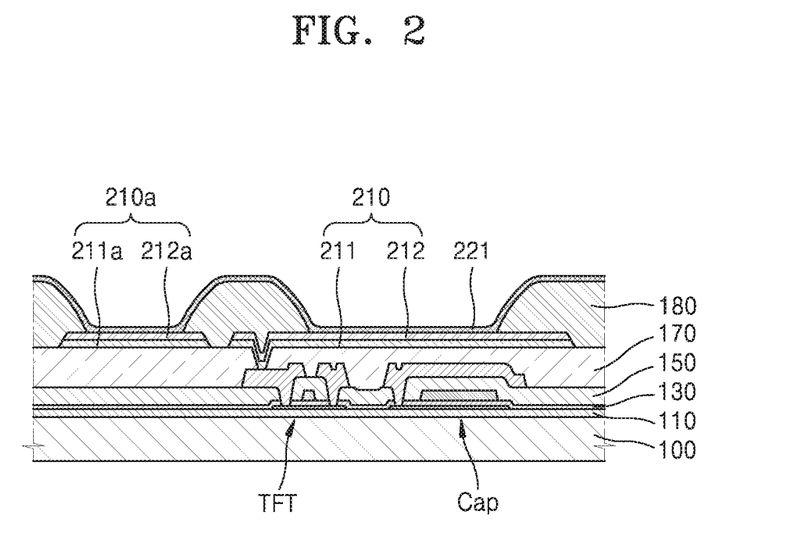

Referring to FIG. 2, the first intermediate layer 221 may be formed on the pixel definition layer 180, the pixel electrode 210, and the auxiliary electrode 210a. The first intermediate layer 221 may be integrally formed over a plurality of pixels.

The first intermediate layer 221 may have a single-layer structure or a multilayer structure. For example, when the first intermediate layer 221 is formed of a polymer material, the first intermediate layer 221 may be a hole transport layer (HTL) that is a single-layer structure including at least one of poly(ethylenedioxythiophene): poly-3,4-ethylene-dihydroxy thiophene and/or polyaniline (PANI). When the first intermediate layer 221 is formed of a low-molecular weight material, the first intermediate layer 221 may include a hole injection layer (HIL) and the HTL.

Figure 3:
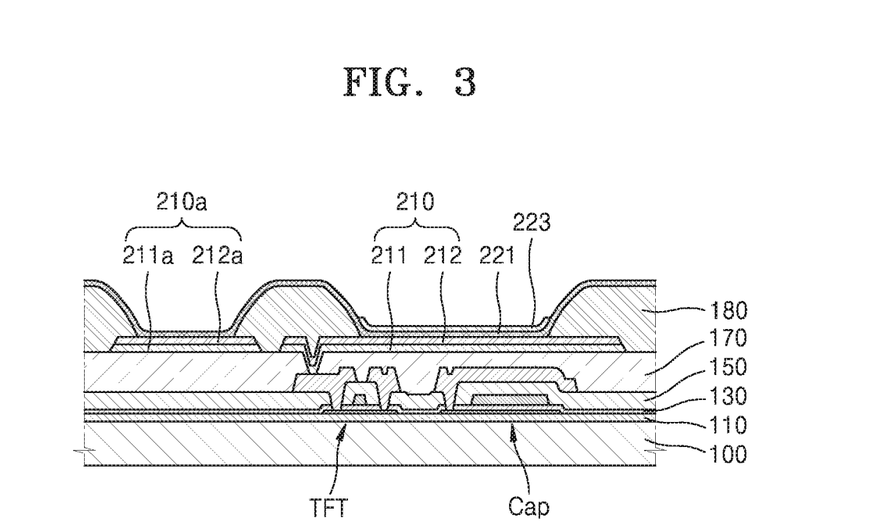

Referring to FIG. 3, an emission layer 223 is formed on the first intermediate layer 221 corresponding to the pixel electrode 210.

Figure 4:
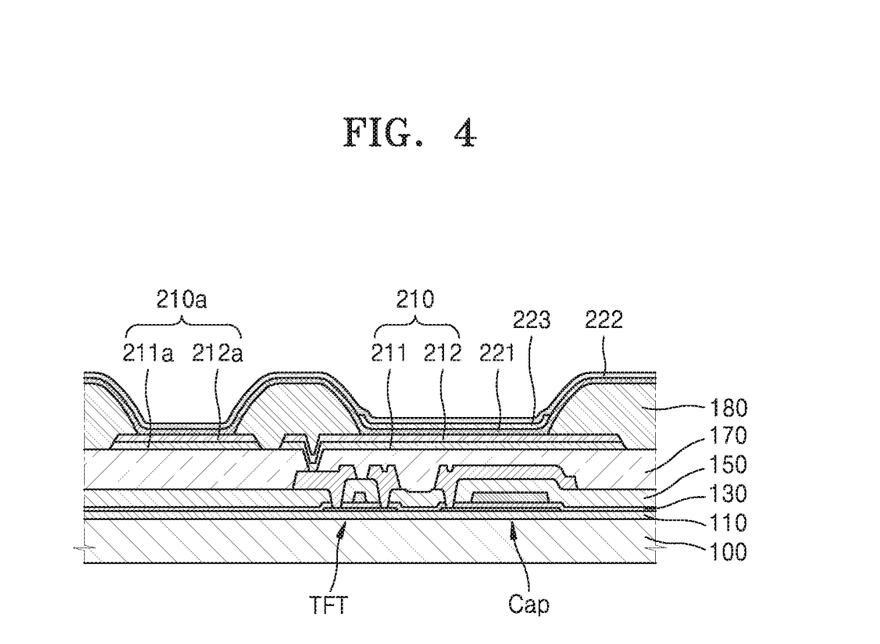

Referring to FIG. 4, a second intermediate layer 222 is formed covering the first intermediate layer 221 and the emission layer 223. According to one or more exemplary embodiments, the second intermediate layer 222 may be omitted. For example, when the first intermediate layer 221 and the emission layer 223 are formed of a polymer material, the second intermediate layer 222 may be omitted. When the first intermediate layer 221 and the emission layer 223 are formed of a low-molecular weight material, the second intermediate layer 222 may be formed, and the characteristics of the organic light-emitting device may be improved. In this case, the second intermediate layer 222 may have a single layer or multilayer structure. The second intermediate layer 222 may include an electron transport layer (ETL) and/or an electron injection layer (EIL).

Figure 5:
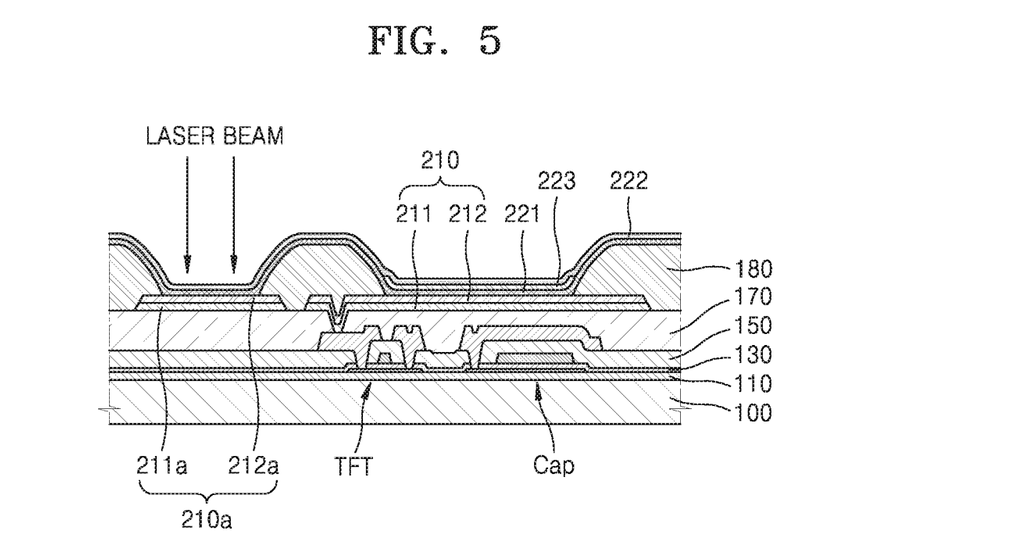
Figure 6:
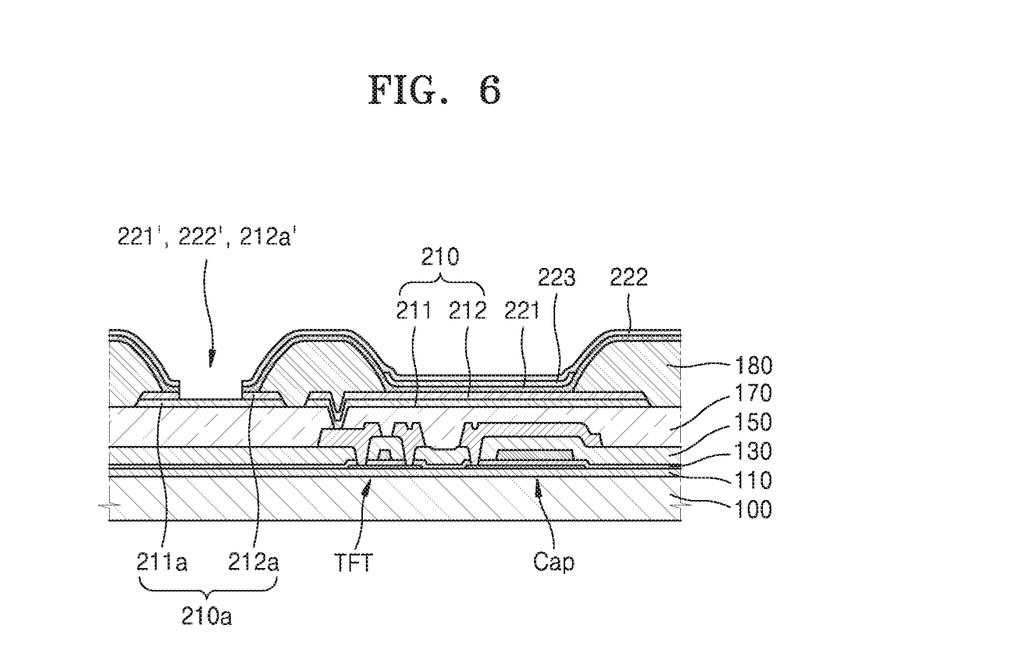

Referring to FIG. 6, a first opening 221' and a second opening 222' may be respectively formed in the first intermediate layer 221 and the second intermediate layer 222 by removing respective portions of the first intermediate layer 221 and the second intermediate layer 222 corresponding the auxiliary electrode 210a, and an opening portion 212a' may be formed in the second conductive layer 212a of the auxiliary electrode 210a by removing a portion of the auxiliary electrode 210a, thereby exposing at least a part of the first conductive layer 211a of the auxiliary electrode 210a. Referring to FIG. 5, the opening portion 212a' formed in the second conductive layer 212a, the first opening 221' formed in the first intermediate layer 221, and the second opening 222' formed in the second intermediate layer 222 may be simultaneously formed by radiating a laser beam onto a corresponding area of the second intermediate layer 222.

For example, a laser beam having a power of about 45 mW or higher may be radiated by using a 355 nm UV laser beam to form the opening portion 212a' in the second conductive layer 212a formed of ITO having a thickness of about 70 Å.

Figure 7A:
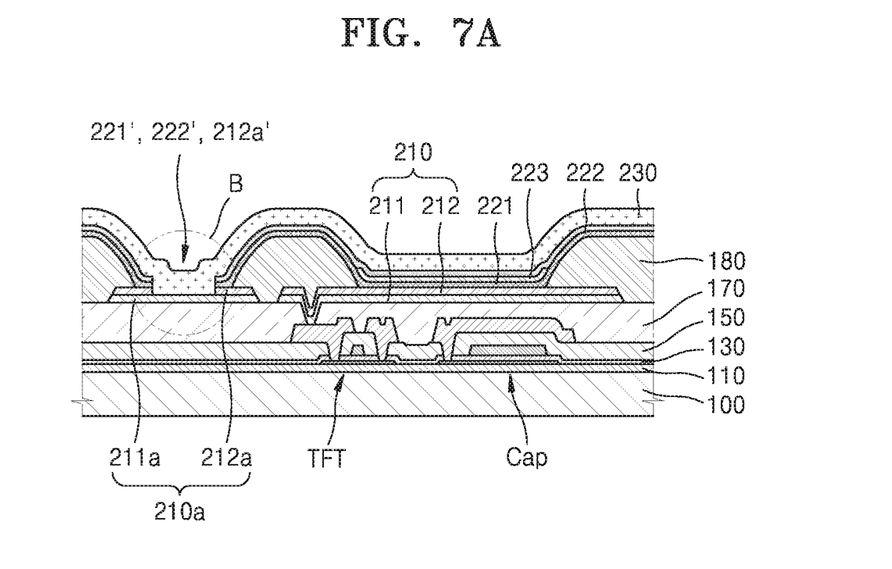

Referring to FIG. 7A, an opposite electrode 230 is formed corresponding to the pixel electrode 210 and the auxiliary electrode 210a and contacting the first conductive layer 211a of the auxiliary electrode 210a through the opening portion 212a', the first opening 221', and the second opening 222' respectively formed in the second conductive layer 212a, the first intermediate layer 221, and the second intermediate layer 222. The opposite electrode 230 is formed integrally with respect to the pixels, covering a display region (active region). The display region may refer to area of the whole organic light-emitting display apparatus from where light may be emitted, for example, an entire area of the organic light-emitting display apparatus except for edges of the organic light-emitting display apparatus in where a controller, etc. may be disposed. When the entire area of the organic light-emitting display apparatus does not include a dead are or a non-emitting area, the entire area of the organic light-emitting display apparatus may be referred to as the display region.

The opposite electrode 230 may contact an electrode power supply line (not shown) disposed outside the display region and receive an electric signal from the electrode power supply line. The opposite electrode 230 may be formed of a layer including at least one or Lithium (Li), Calcium (Ca), Lithium Fluoride/Calcium (LiF/Ca), Lithium Fluoride/Aluminum (LiF/Al), Aluminum (Al), Silver (Ag), Magnesium (Mg), and alloys thereof, and/or a conductive oxide including at least one of ITO, IZO, ZnO, and $In_2O_3$. However, the structure and material of the opposite electrode 230 are not limited thereto, and the opposite electrode 230 may be formed of other materials. Also, the layered structure may be a single-layer structure or a multilayer structure and may have a variety of modifications thereto without departing from the scope of the present invention.

According to the exemplary method of manufacturing an organic light-emitting display apparatus according to the exemplary embodiments, since an electric signal is transmitted through the auxiliary electrode 210a having a high electric conductivity, and the opposite electrode 230 contacts the auxiliary electrode 210a, an IR drop, that may occur in the opposite electrode 230 when the auxiliary electrode 210a is omitted, may be prevented or reduced. Accordingly, an unintended deviation in brightness in the pixels may be reduced or prevented.

In particular, the auxiliary electrode 210a includes the first conductive layer 211a and the second conductive layer 212a, and the resistance of the first conductive layer 211a disposed in a lower side of the auxiliary electrode 210a is configured to be lower than the resistance of the second conductive layer 212a disposed in a upper side of the auxiliary electrode 210a. Thus, by disposing the opposite electrode 230 to directly contact the first conductive layer 211a having a relatively lower resistance, the IR drop in the opposite electrode 230 may be reduced or prevented.

For example, the first conductive layer 211a may be formed of Ag, the second conductive layer 212a may be formed of ITO, and the opposite electrode 230 may be formed of Mg and Ag. In such a case, if the opposite electrode 230 is disposed to directly contact the second conductive layer 212a, a contact resistance may be about 170Ω. However, if the opposite electrode 230 is disposed to directly contact the first conductive layer 211a, the contact resistance may be reduced to about 60Ω.

Referring to FIG. 7A, to directly contact the opposite electrode 230 and the first conductive layer 211a of the auxiliary electrode 210a, at least a part of the first conductive layer 211a may be not covered by the second conductive layer 212a, the first intermediate layer 221, and the second intermediate layer 222. Accordingly, the second conductive layer 212a, the first intermediate layer 221, and the second intermediate layer 222 may be formed so that the second conductive layer 212a, the first intermediate layer 221, and the second intermediate layer 222 are not disposed on at least a part of the first conductive layer 211a. In this case, however, a mask may be used for forming the second conductive layer 212a, the first intermediate layer 221, and the second intermediate layer 222. Accordingly, a manufacturing process may be complicated, for example, to accurately align the mask and the substrate 100 with each other.

According to the exemplary method of manufacturing an organic light-emitting display apparatus according to the exemplary embodiments, the second conductive layer 212a may be formed in the same shape as the first conductive layer 211a, the first intermediate layer 221 and the second intermediate layer 222 may be formed, for example, on an entire surface of the substrate 100, and the second conductive layer 212a, the first intermediate layer 221, and the second intermediate layer 222 corresponding to at least a part of the first conductive layer 211a may be selectively removed using a laser beam, and thus, manufacturing efficiency may be improved.

Figure 7B:
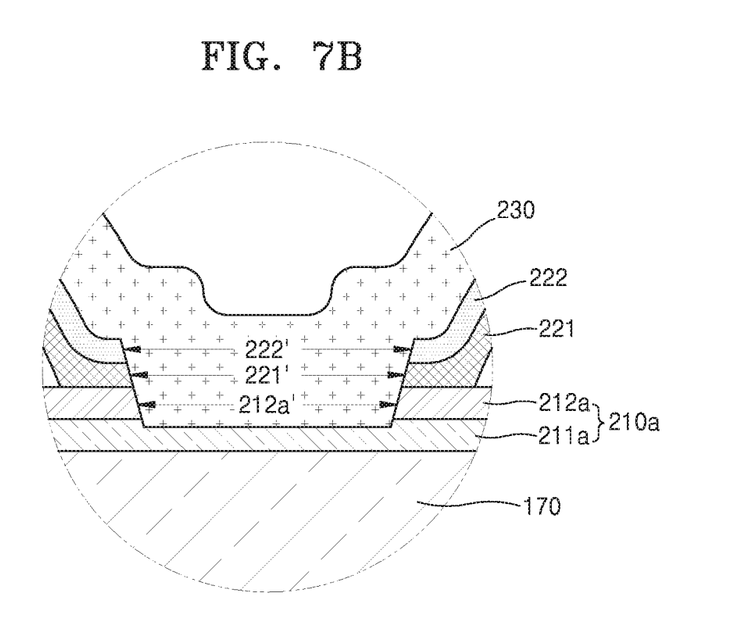

FIGS. 7A and 7B are cross-sectional views of an organic light-emitting display apparatus, according to one or more exemplary embodiments. Although FIGS. 6 and 7A illustrate that the sizes of the first opening 221' of the first intermediate layer 221, the second opening 222' of the second intermediate layer 222, and the opening portion 212a' of the second conductive layer 212a of the auxiliary electrode 210a are the same, the sizes thereof may be formed different from one another. Referring to FIG. 7B which shows a modified embodiment corresponding to portion B of FIG. 7A, since the laser beam is radiated directly onto the second intermediate layer 222, the second opening 222' of the second intermediate layer 222 may be formed to have a size larger than that of the first opening 221' of the first intermediate layer 221. The first opening 221' of the first intermediate layer 221 may be formed to have a size larger than that of the opening portion 212a' of the second conductive layer 212a. The first opening 221' of the first intermediate layer 221, the second opening 222' of the second intermediate layer 222, and the opening portion 212a' of the second conductive layer 212a of the auxiliary electrode 210a may have circular shapes. In this case, the above-described sizes may refer to respective radii of the first opening 221' of the first intermediate layer 221, the second opening 222' of the second intermediate layer 222, and the opening portion 212a' of the second conductive layer 212a of the auxiliary electrode 210a.

If the second intermediate layer 222 is omitted as described above, the first opening 221' and the opening portion 212a' may be formed by radiating the laser beam directly onto the first intermediate layer 221 to remove at least a part of the first intermediate layer 221 and the second conductive layer 212a disposed on the first conductive layer 211a, and thus, at least a part of the first conductive layer 211a may be exposed. The opposite electrode 230 formed corresponding to the pixel electrode 210 and the auxiliary electrode 210a may directly contact the first conductive layer 211a through the first opening 221' of the first intermediate layer 221 and the opening portion 212a' of the second conductive layer 212a.

When the opening portion 212a', the first opening 221' and/or the second opening 222' are formed, as illustrated in FIGS. 7A and 7B, only a part of the first conductive layer 211a may be exposed. For example, in the display region of the organic light-emitting display apparatus, the first openings 221', the second openings 222' and/or the opening portions 212a', which are approximately circular, may be formed, and a plurality of parts of the opposite electrode 230 may directly contact the first conductive layer 211a.

The first intermediate layer 221 and the emission layer 223 may be relatively weak to external impurities, such as moisture. Accordingly, when the first intermediate layer 221 and the emission layer 223 are formed without the second intermediate layer 222, removing a part of the first intermediate layer 221 by radiating the laser beam may damage the first intermediate layer 221 and the emission layer 223 along the above process. Accordingly, the second intermediate layer 222 may be disposed, and the first opening 221' and the second opening 222' may be simultaneously formed by radiating the laser beam. In particular, the second intermediate layer 222 including at least one of LiF and 8-Hydroxyquinolinolatolithium (Liq) may improve the ohmic contact of the opposite electrode 230. In addition, the second intermediate layer 222 including at least one of LiF and Liq may improve the weakness to the external impurities, and thus, damage of the first intermediate layer 221, the emission layer 223, and the second intermediate layer 222 during the process of forming the first opening 221', the second opening 222', and the opening portion 212a' by radiating the laser beam thereon may be reduced or prevented.

According to the above description, during formation of the opening portion 212a', the first opening 221', and/or the second opening 222', the second conductive layer 212a, the first intermediate layer 221, and/or the second intermediate layer 222 may be partially removed by radiating the laser beam. During this process, at least a part of an upper surface of the first conductive layer 211a may be removed as well, as shown in FIG. 7B. In other words, a groove may be formed in the upper surface of the first conductive layer 211a corresponding to the opening portion 212a'. Accordingly, the exemplary embodiments and modified examples may have a groove formed in the upper surface of the first conductive layer 211a.

FIGS. 8, 9, 10, and 11 are cross-sectional views schematically illustrating processes of an exemplary method of manufacturing an organic light-emitting display apparatus, according to one or more exemplary embodiments. Elements of the organic light-emitting display apparatus according to the one or more exemplary embodiments that are substantially the same with the organic light-emitting display apparatus illustrated in FIGS. 1, 2, 3, 4, 5, 6, 7A, and 7B may have be indicated with same number and the detailed description of the substantially same elements may be omitted.

Figure 8:
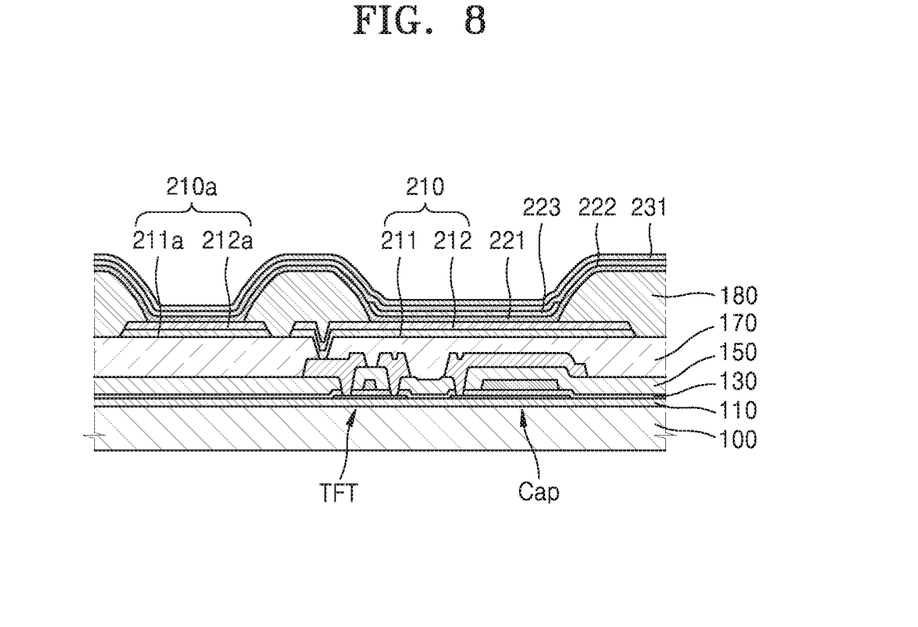
FIGS. 8, 9, 10, and 11 are cross-sectional views schematically illustrating processes of an exemplary method of manufacturing an organic light-emitting display apparatus, according to one or more exemplary embodiments.

According to the exemplary method of manufacturing an organic light-emitting display apparatus according to the exemplary embodiments, as described above with reference to FIGS. 1, 2, 3, and 4, the second intermediate layer 222 is formed and, as illustrated in FIG. 8, an auxiliary opposite electrode 231 may be formed corresponding to the pixel electrode 210 and the auxiliary electrode 210a. In other words, the auxiliary opposite electrode 231 is formed to cover the second intermediate layer 222. If the second intermediate layer 222 is omitted, the auxiliary opposite electrode 231 may be formed to cover the first intermediate layer 221 and the emission layer 223. The above-described material for the opposite electrode 230, for example, may be used as a material for the auxiliary opposite electrode 231.

Figure 9:
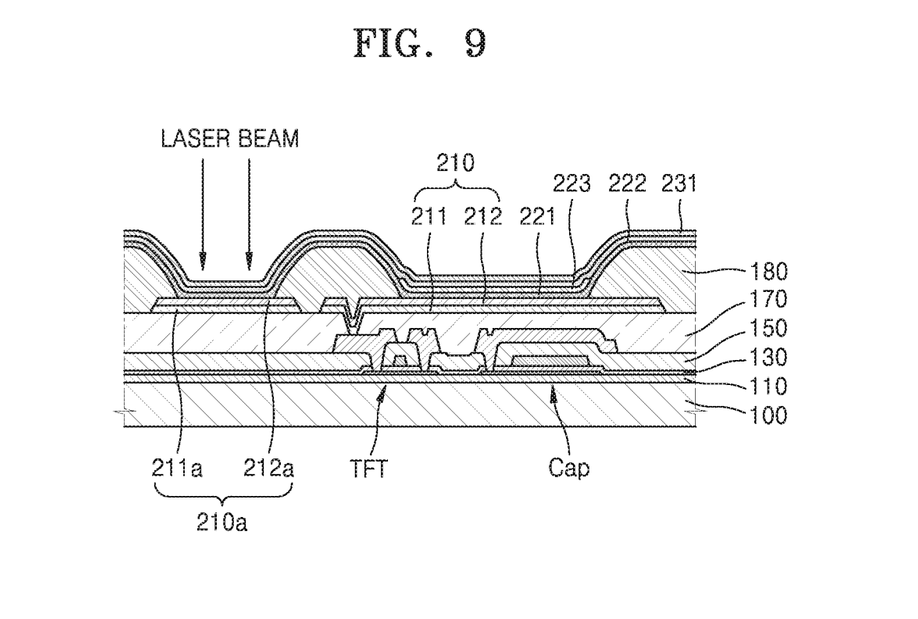
Figure 10:
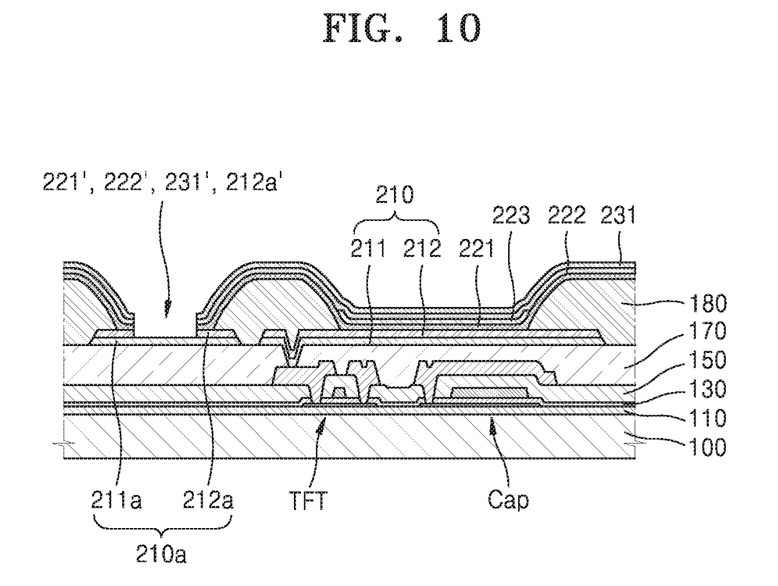

Referring to FIG. 9, a laser beam is radiated onto at least a part of the auxiliary opposite electrode 231, and thus, the first opening 221' in the first intermediate layer 221, the second opening 222' in the second intermediate layer 222, a third opening 231' in the auxiliary opposite electrode 231, and the opening portion 212a' in the second conductive layer 212a, may be simultaneously formed, as illustrated in FIG. 10. If the second intermediate layer 222 is omitted, the first opening 221' of the first intermediate layer 221, the third opening 231' of the auxiliary opposite electrode 231, and the opening portion 212a' of the second conductive layer 212a may be simultaneously formed by radiating the laser beam onto at least a part of the auxiliary opposite electrode 231.

Figure 11:
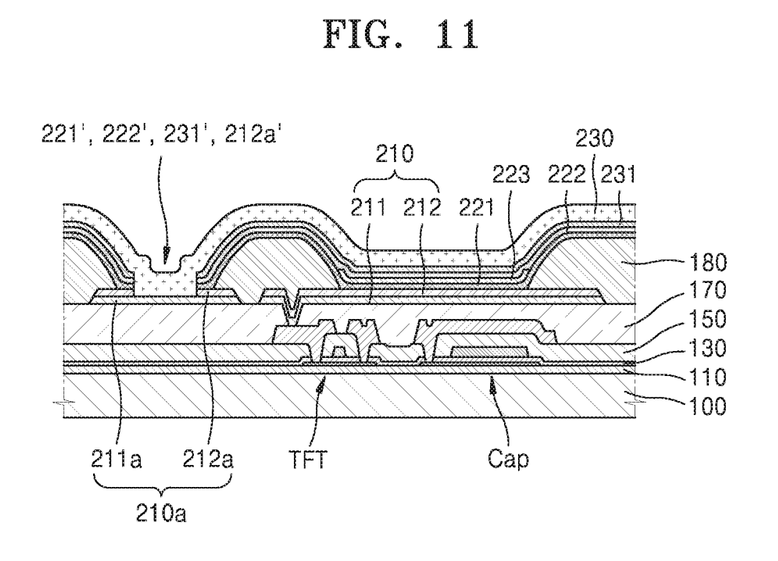

Referring to FIG. 11, the opposite electrode 230 is formed corresponding to the pixel electrode 210 and the auxiliary electrode 210a and contacting the first electrode layer 211a through the first opening 221', the second opening 222', the third opening 231', and the opening portion 212a' respectively formed in the first intermediate layer 221, the second intermediate layer 222, the auxiliary opposite electrode 231, and the second conductive layer 212a. The opposite electrode 230 may be formed integrally with respect to the pixels, covering the display region (active region).

According to the exemplary method of manufacturing an organic light-emitting display apparatus according to the exemplary embodiments, since the auxiliary electrode 210a is formed and the opposite electrode 230 is disposed to contact the auxiliary electrode 210a, an electric signal is transferred through the auxiliary electrode 210a having a high electric conductivity and thus, the IR drop, that may occur in the opposite electrode 230 when the auxiliary electrode 210a is omitted, may be prevented or reduced. As a result, the unintended brightness deviation in the pixels may be reduced or prevented.

In particular, the auxiliary electrode 210a includes the first conductive layer 211a and the second conductive layer 212a, the resistance of the first conductive layer 211a disposed in the lower side of the auxiliary electrode 210a is configured to be lower than the resistance of the second conductive layer 212a disposed in the upper side of the auxiliary electrode 210a, the opposite electrode 230 directly contacts the first conductive layer 211a having a relatively lower resistance, and thus, the IR drop in the opposite electrode 230 may be reduced or prevented.

Also, the second conductive layer 212a may be formed to have the same shape of the first conductive layer 211a, the first intermediate layer 221, and/or the second intermediate layer 222 may be formed, for example, on the entire surface of the substrate 100. The second conductive layer 212a, the first intermediate layer 221, and/or the second intermediate layer 222 disposed corresponding to at least a part of the first conductive layer 211a may be selectively removed using the laser beam, to directly contact the opposite electrode 230 and the first conductive layer 211a. Accordingly, manufacturing efficiency may be improved.

According to the exemplary method of manufacturing an organic light-emitting display apparatus according to the exemplary embodiments, the laser beam may be radiated after disposing the auxiliary opposite electrode 231 on the second intermediate layer 222, or the first intermediate layer 221 and the emission layer 223 if the second intermediate layer 222 is omitted formed. Accordingly, the laser beam is radiated after the auxiliary opposite electrode 231 is disposed on the first intermediate layer 221, the second intermediate layer 222, and/or the emission layer 223, which may be weak to the external impurities, damage to the first intermediate layer 221, the second intermediate layer 222, and/or the emission layer 223 may be reduced compared to radiating the laser beam onto the first intermediate layer 221 and/or the second intermediate layer 222 without disposing the auxiliary opposite electrode 231, and thus, a manufacturing defect may be reduced.

According to the exemplary method of manufacturing an organic light-emitting display apparatus according to the exemplary embodiments, a part of the auxiliary opposite electrode 231 may be removed by radiating the laser beam onto the auxiliary opposite electrode 231. Accordingly, forming the auxiliary opposite electrode 231 relatively thin may facilitate the above removing. On the other hand, if the light generated by the emission layer 223 is emitted to the outside through the substrate 100, the opposite electrode 230 may be formed relatively thick considering an electric conductivity, etc. As a result, the opposite electrode 230 may be formed thicker than the auxiliary opposite electrode 231.

Figure 12:
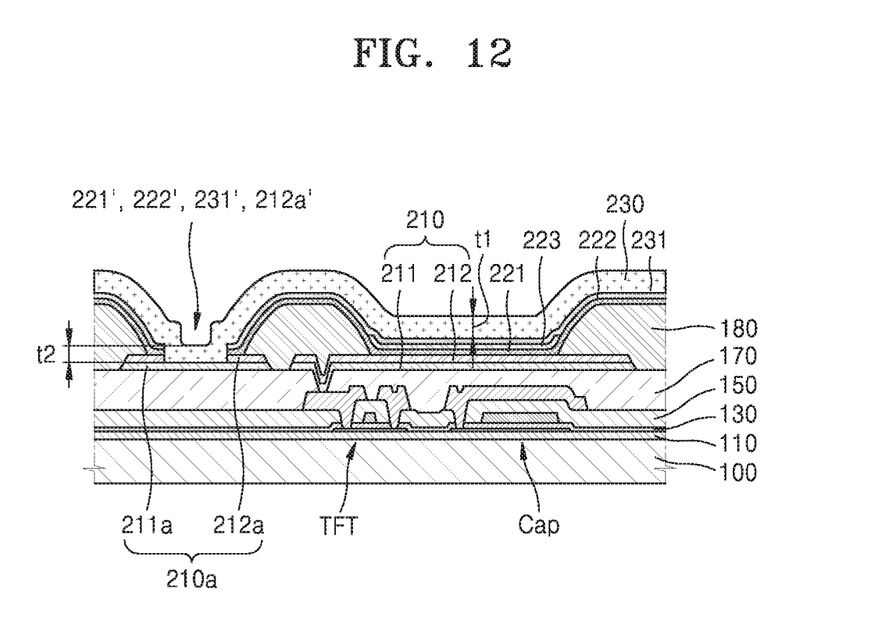
FIG. 12 is a cross-sectional view schematically illustrating an organic light-emitting display apparatus manufactured according to an exemplary method of manufacturing an organic light-emitting display apparatus, according to one or more exemplary embodiments.

If the auxiliary opposite electrode 231 and the opposite electrode 230 are formed of the same material, the auxiliary opposite electrode 231 and the opposite electrode 230 may show any boundary therebetween in a final product according to a process condition. In this case, the auxiliary opposite electrode 231 and the opposite electrode 230 may be collectively referred to as the opposite electrode 230. Referring to FIG. 12, a thickness t2 of a part of the opposite electrode 230 corresponding to a center portion of the first opening 221' may appear to be smaller than a thickness t1 of a part of the opposite electrode 230 corresponding to a center portion of the pixel electrode 210. This is because the opposite electrode 230 formed in the part on the pixel electrode 210 includes two layers of the auxiliary opposite electrode 231 and the opposite electrode 230, and the opposite electrode 230 formed in the center portion of the first opening 221' includes one layer of the opposite electrode 230.

Although the exemplary embodiments illustrate that the auxiliary electrode 210a is disposed in the same layer as the pixel electrode 210, the exemplary embodiments are not limited thereto. For example, the auxiliary electrode 210a may be located at the same layer as the source electrode and/or drain electrode, which are electrodes of the TFT. In this case, the auxiliary electrode 210a is covered with the planarization layer 170. In this case, an opening may be formed in the planarization layer 170 to expose at least a part of the auxiliary electrode 210a. The opening may be formed simultaneously with a via hole, through which the pixel electrode 210 contacts the source electrode and/or drain electrode of the TFT. A portion of the auxiliary electrode 210a that is not covered by the planarization layer 170 may be exposed by the pixel definition layer 180 as well. The subsequent processes may be substantially the same as or similar to those described with reference to FIGS. 1 to 12, except for the fact that the auxiliary electrode 210a is disposed in different layers.

Although the exemplary embodiments above illustrates that the auxiliary electrode 210a has a dual layer structure including the first conductive layer 211a and the second conductive layer 212a, the exemplary embodiments are not limited thereto, and the auxiliary electrode 210a may have a multilayer structure including three or more layers. For example, referring to FIG. 13, the auxiliary electrode 210a may include the first conductive layer 211a, the second conductive layer 212a disposed on the first conductive layer 211a and having resistance higher than that of the first conductive layer 211a, and a third conductive layer 213a disposed under the first conductive layer 211a and having resistance higher than that of the first conductive layer 211a. The second conductive layer 212a and the third conductive layer 213a may include the same material. For example, the first conductive layer 211a may include at least one of Ag, Mg, Al, Pt, Pd, Au, Ni, Nd, Ir, Cr, and alloys thereof, and the second conductive layer 212a and the third conductive layer 213a may include a light-transmissive conductive material including at least one of indium tin oxide (ITO), indium zinc oxide (IZO), zinc oxide (ZnO), indium oxide ($In_2O_3$), indium gallium oxide (IGO), and aluminum zinc oxide (AZO).

Figure 13:
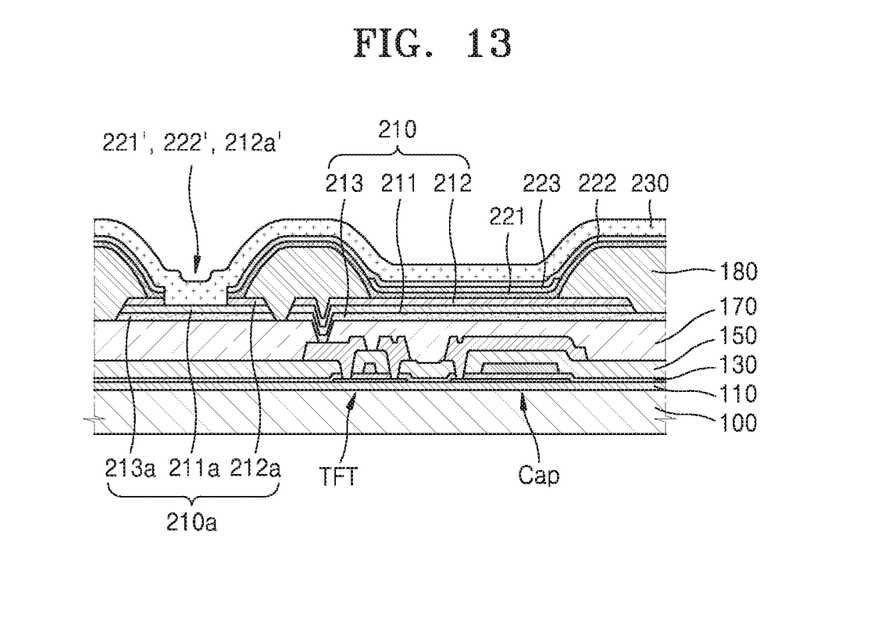
FIG. 13 is a cross-sectional view schematically illustrating an organic light-emitting display apparatus manufactured according to an exemplary method of manufacturing an organic light-emitting display apparatus according to one or more exemplary embodiments.

When the auxiliary electrode 210a is located at the same layer as the pixel electrode 210, the pixel electrode 210 may have the same structure as that of the auxiliary electrode 210a. The pixel electrode 210 may include the first electrode layer 211 including the same material as that of the first conductive layer 211a of the auxiliary electrode 210a, the second electrode layer 212 disposed on the first electrode layer 211 and including the same material as that of the second conductive layer 212a of the auxiliary electrode 210a, a third electrode layer 213 disposed under the first electrode layer 211 and including the same material as that of the third conductive layer 213a of the auxiliary electrode 210a. For reference, each of the auxiliary electrode 210a and the pixel electrode 210 may have a triple layer structure as above, so that the pixel electrode 210 may contact the source electrode and/or drain electrode of the TFT thereunder, forming an ohmic contact. In other words, the pixel electrode 210 may include the third electrode layer 213, and the third electrode layer 213 may directly contact the source electrode and/or drain electrode of the TFT, forming an ohmic contact. For reference, the source electrode and/or drain electrode may be formed of a variety of conductive materials and may have a triple layer structure of, for example, Al/Ti/Al.

In the above case, the opening portion 212a' is formed in the second conductive layer 212a of the auxiliary electrode 210a, and the opposite electrode 230 may directly contact the first conductive layer 211a of the auxiliary electrode 210a through the first opening 221' of the first intermediate layer 221 and the opening portion 212a' of the second conductive layer 212a. If the second intermediate layer 222 is disposed, the opposite electrode 230 may directly contact the first conductive layer 211a of the auxiliary electrode 210a through the first opening 221' of the first intermediate layer 221, the second opening 222' of the second intermediate layer 222, and the opening portion 212a' of the second conductive layer 212a. If the auxiliary opposite electrode 231 is disposed, the opposite electrode 230 may directly contact the first conductive layer 211a of the auxiliary electrode 210a through the first opening 221' of the first intermediate layer 221, the second opening 222' of the second intermediate layer 222, the third opening 231' of the auxiliary opposite electrode 231, and the opening portion 212a' of the second conductive layer 212a.

The exemplary embodiments are not limited to the above described exemplary methods for manufacturing an organic light-emitting display apparatus according to the exemplary embodiments. For example, the exemplary embodiments also include the organic light-emitting display apparatus manufactured by the above exemplary methods.

For example, an organic light-emitting display apparatus according to one or more exemplary embodiments may have a configuration as illustrated in FIG. 7A.

The organic light-emitting display apparatus according to the exemplary embodiments includes the auxiliary electrode 210a including the first conductive layer 211a and the second conductive layer 212a disposed on the first conductive layer 211a. The second conductive layer 212a has the opening portion 212a' that exposes the first conductive layer 211a. Also, the resistance of the second conductive layer 212a may be higher than that of the first conductive layer 211a. For example, the first conductive layer 211a may include at least one of Ag, Mg, Al, Pt, Pd, Au, Ni, Nd, Ir, Cr, and alloys thereof, and the second conductive layer 212a may include a light-transmissive conductive material including at least one of indium tin oxide (ITO), indium zinc oxide (IZO), zinc oxide (ZnO), indium oxide ($In_2O_3$), indium gallium oxide (IGO), and aluminum zinc oxide (AZO).

Referring to FIGS. 1 and 7A, the organic light-emitting display apparatus according to the exemplary embodiments includes the pixel electrode 210 in addition to the auxiliary electrode 210a. In detail, the organic light-emitting display apparatus according to the exemplary embodiments may include the pixel electrode 210 that is disposed on the same layer as the auxiliary electrode 210a, separated and electrically insulated from the auxiliary electrode 210a. Although FIG. 1 illustrates that the pixel electrode 210 and the auxiliary electrode 210a are disposed on the planarization layer 170, the exemplary embodiments are not limited thereto. Thus, the pixel electrode 210 and the auxiliary electrode 210a disposed on the same layer may have the same structure. In other words, the pixel electrode 210 may include the first electrode layer 211 including substantially the same material as that of the first conductive layer 211a of the auxiliary electrode 210a, and the second electrode layer 212 disposed on the first electrode layer 211, including substantially the same material as that of the second conductive layer 212a of the auxiliary electrode 210a.

The organic light-emitting display apparatus may include the pixel definition layer 180, and at least a part of the pixel electrode 210 and at least a part of the first conductive layer 211a of the auxiliary electrode 210a may be exposed, and the opposite electrode 230 disposed corresponding to the pixel electrode 210 and the auxiliary electrode 210a and directly contacting the first conductive layer 211a of the auxiliary electrode 210a.

The organic light-emitting display apparatus according to the exemplary embodiments may include the first intermediate layer 221 and the second intermediate layer 222. The first intermediate layer 221 and the second intermediate layer 222 are disposed on the pixel definition layer 180, the pixel electrode 210, and the auxiliary electrode 210a. The emission layer 223 may be interposed between the first intermediate layer 221 and the second intermediate layer 222 corresponding to the pixel electrode 210. To directly contact the first conductive layer 211a of the auxiliary electrode 210a and the opposite electrode 230, the first intermediate layer 221 and the second intermediate layer 222 may have the first opening 221' and the second opening 222' corresponding to the opening portion 212a' of the second conductive layer 212a of the auxiliary electrode 210a. The second intermediate layer 222 may be omitted.

The organic light-emitting display apparatus according to the exemplary embodiments includes the auxiliary electrode 210a and the opposite electrode 230 directly contacts the auxiliary electrode 210a, so the electric signal may be transmitted through the auxiliary electrode 210a having a high electric conductivity, and thus, the IR drop, that may occur in the opposite electrode 230 when the auxiliary electrode 210a does not exist, may be prevented or reduced. Accordingly, the unintended brightness deviation in a plurality of pixels may be reduced or prevented.

In particular, the auxiliary electrode 210a includes the first conductive layer 211a and the second conductive layer 212a, and the resistance of the first conductive layer 211a disposed in the lower side of the auxiliary electrode 210a is lower than that of the second conductive layer 212a disposed in the higher side of the auxiliary electrode 210a. The opposite electrode 230 directly contacts the first conductive layer 211a having a lower resistance, and thus the IR drop in the opposite electrode 230 may be prevented or reduced.

As described above, to directly contact the opposite electrode 230 and the first conductive layer 211a, the second conductive layer 212a, the first intermediate layer 221, and/or the second intermediate layer 222, may respectively include the opening portion 212a', the first opening 221', and/or the second opening 222' formed in respective portions corresponding with the first conductive layer 211a to expose at least a part of the first conductive layer 211a. A manufacturing yield may be increased by forming the above openings by forming the second conductive layer 212a having substantially the same pattern as that of the first conductive layer 211a, forming the first intermediate layer 221 and/or the second intermediate layer 222 on the entire surface of the substrate 100, and radiating a laser beam onto a predetermined portion to remove at least parts of the second conductive layer 212a, the first intermediate layer 221, and/or the second intermediate layer 222 corresponding with the first conductive layer 211a. Accordingly, in the organic light-emitting display apparatus according to the exemplary embodiments, a part of the first intermediate layer 221 and the second intermediate layer 222 respectively adjacent to the first opening 221' and the second opening 222' may be deteriorated or degraded from exposure to heat.

Although FIG. 7A illustrates that the sizes of the first opening 221' of the first intermediate layer 221, the second opening 222' of the second intermediate layer 222, and the opening portion 212a' of the second conductive layer 212a of the auxiliary electrode 210a are identical to one another, this is merely for convenience of explanation and the sizes of the openings may be formed different from one another. For example, as illustrated in FIG. 7B, since the laser beam is directly radiated onto the second intermediate layer 222, the second opening 222' of the second intermediate layer 222 may be formed to have a size larger than that of the first opening 221' of the first intermediate layer 221. The first opening 221' of the first intermediate layer 221 may be formed to have a size larger than that of the opening portion 212a' of the second conductive layer 212a. Each of the first opening 221' of the first intermediate layer 221, the second opening 222' of the second intermediate layer 222, and the opening portion 212a' of the second conductive layer 212a of the auxiliary electrode 210a may have a circular shape. In this case, the above-described sizes may refer to respective radii of the first opening 221' of the first intermediate layer 221, the second opening 222' of the second intermediate layer 222, and the opening portion 212a' of the second conductive layer 212a of the auxiliary electrode 210a. Since the first opening 221', the second opening 222', and the opening portion 212a' are formed at the same time, the centers of the openings may be aligned with each other.

When the first opening 221', the second opening 222', and/or the opening portion 212a' are formed, only a part of the first conductive layer 211a may be exposed as illustrated in FIG. 7A. For example, by forming a plurality of the first openings 221', the second openings 222', and/or the opening portions 212a', which are approximately circular, in the display region of the organic light-emitting display apparatus, a plurality of portions of the opposite electrode 230 may directly contact the first conductive layer 211a.

As described above, during the formation of the opening portion 212a', the first opening 221', and/or the second opening 222', respectively, the second conductive layer 212a, the first intermediate layer 221, and/or the second intermediate layer 222 may be partially removed by radiating the laser beam, at least a part of the upper surface of the first conductive layer 211a may be removed as well in the process. In other words, a groove may be formed in the upper surface of the first conductive layer 211a corresponding to the opening portion 212a'. Accordingly, the exemplary embodiments and modified examples may have a groove formed in the upper surface of the first conductive layer 211a, as shown in FIG. 7B.

The first intermediate layer 221 and the emission layer 223 may be relatively weak to the external impurities, such as moisture. Accordingly, when the first intermediate layer 221 and the emission layer 223 are formed without the second intermediate layer 222, removing a part of the first intermediate layer 221 by radiating the laser beam may damage the first intermediate layer 221 and the emission layer 223 along the above process. Accordingly, the second intermediate layer 222 may be disposed, and the first opening 221' and the second opening 222' are simultaneously formed by radiating the laser beam. In particular, the second intermediate layer 222 including at least one of LiF and Liq may improve the ohmic contact of the opposite electrode 230. In addition, the second intermediate layer 222 including at least any one of LiF and Liq may improve the weakness to the foreign impurities. Thus, the damage to the first intermediate layer 221, the emission layer 223, and the second intermediate layer 222 during the process of forming the first opening 221', the second opening 222', and the opening portion 212a' by radiating the laser beam thereon may be reduced or prevented.

An organic light-emitting display apparatus according to one or more exemplary embodiments may have a configuration as illustrated in FIG. 11. In other words, the auxiliary opposite electrode 231 may be further interposed between the opposite electrode 230 and the first intermediate layer 221 to contact the opposite electrode 230, having the third opening 231' corresponding to the first opening 221' of the first intermediate layer 221. In other words, the auxiliary opposite electrode 231 may be disposed correspond to the opposite electrode 230 except in a portion of the auxiliary opposite electrode 231 that overlaps with the first opening 221' of the first intermediate layer 221.

The organic light-emitting display apparatus according to the exemplary embodiments may prevent or reduce the IR drop of the opposite electrode 230 by providing the auxiliary electrode 210a. In addition, the auxiliary opposite electrode 231 may protect the first intermediate layer 221, the emission layer 223, and/or the second intermediate layer 222 during forming the opening portion 212a' of the second conductive layer 212a, the first opening 221' of the first intermediate layer 221, and/or the second opening 222' of the second intermediate layer 222 are formed, and thus, damages to the first intermediate layer 221, the emission layer 223, and/or the second intermediate layer 222 may be reduced or prevented. The thickness of the auxiliary opposite electrode 231 may be smaller than that of the opposite electrode 230.

Referring to FIG. 12, the auxiliary opposite electrode 231 and the opposite electrode 230 may be integrally formed. In this case, the thickness t2 of the part of the opposite electrode 230 corresponding to the center portion of the first opening 221' may be smaller than the thickness t1 of the part of the opposite electrode 230 corresponding to a center portion of the pixel electrode 210. This is because the opposite electrode 230 formed in the part on the pixel electrode 210 includes two layers of the auxiliary opposite electrode 231 and the opposite electrode 230, and the opposite electrode 230 is formed in the center portion of the first opening 221' includes one layer of the opposite electrode 230.

Although the exemplary embodiments illustrate that the auxiliary electrode 210a is disposed in the same layer as the pixel electrode 210, the exemplary embodiments are not limited thereto. For example, the auxiliary electrode 210a may be located at the same layer as the source electrode and/or drain electrode, which are electrodes of the TFT. In this case, the auxiliary electrode 210a is covered with the planarization layer 170. In this case, an opening may be formed in the planarization layer 170 to expose at least a part of the auxiliary electrode 210a. The opening may be formed simultaneously with a via hole, through which the pixel electrode 210 contacts the source electrode and/or drain electrode of the TFT. A portion of the auxiliary electrode 210a that is not covered by the planarization layer 170 may be exposed by the pixel definition layer 180 as well. The subsequent processes may be substantially the same as or similar to those described with reference to FIGS. 1 to 12, except for the fact that the auxiliary electrode 210a is disposed in different layers.

Although the exemplary embodiments above illustrated that the auxiliary electrode 210a has a dual layer structure including the first conductive layer 211a and the second conductive layer 212a, the exemplary embodiments are not limited thereto, and the auxiliary electrode 210a may have a multilayer structure including three or more layers. For example, referring to FIG. 13, the auxiliary electrode 210a may include the first conductive layer 211a, the second conductive layer 212a disposed on the first conductive layer 211a and having resistance higher than that of the first conductive layer 211a, and the third conductive layer 213a disposed under the first conductive layer 211a and having resistance higher than that of the first conductive layer 211a. The second conductive layer 212a and the third conductive layer 213a may include the same material. For example, the first conductive layer 211a may include at least one of Ag, Mg, Al, Pt, Pd, Au, Ni, Nd, Ir, Cr, and alloys thereof, and the second conductive layer 212a and the third conductive layer 213a may include a light-transmissive conductive material including at least one of indium tin oxide (ITO), indium zinc oxide (IZO), zinc oxide (ZnO), indium oxide ($In_2O_3$), indium gallium oxide (IGO), and aluminum zinc oxide (AZO).

When the auxiliary electrode 210a is located at the same layer as the pixel electrode 210, the pixel electrode 210 may have the same structure as that of the auxiliary electrode 210a. The pixel electrode 210 may include the first electrode layer 211 including the same material as that of the first conductive layer 211a of the auxiliary electrode 210a, the second electrode layer 212 disposed on the first electrode layer 211 and including the same material as that of the second conductive layer 212a of the auxiliary electrode 210a, the third electrode layer 213 disposed under the first electrode layer 211 and including the same material as that of the third conductive layer 213a of the auxiliary electrode 210a.

In the above case, the opening portion 212a' is formed in the second conductive layer 212a of the auxiliary electrode 210a, and the opposite electrode 230 may directly contact the first conductive layer 211a of the auxiliary electrode 210a through the first opening 221' of the first intermediate layer 221 and the opening portion 212a' of the second conductive layer 212a. If the second intermediate layer 222 is disposed, the opposite electrode 230 may directly contact the first conductive layer 211a of the auxiliary electrode 210a through the first opening 221' of the first intermediate layer 221, the second opening 222' of the second intermediate layer 222, and the opening portion 212a' of the second conductive layer 212a. If the auxiliary opposite electrode 231 is disposed, the opposite electrode 230 may directly contact the first conductive layer 211a of the auxiliary electrode 210a through the first opening 221' of the first intermediate layer 221, the second opening 222' of the second intermediate layer 222, the third opening 231' of the auxiliary opposite electrode 231, and the opening portion 212a' of the second conductive layer 212a.

According to the one or more exemplary embodiments, a method of manufacturing of the organic light-emitting display apparatus may be simplified and have relatively high light-emitting stability. However, the exemplary embodiments are not necessarily limited to the above effects.

Although certain exemplary embodiments and implementations have been described herein, other embodiments and modifications will be apparent from this description.

Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
    forming an auxiliary electrode comprising:
        a first conductive layer; and
        a second conductive layer disposed on the first conductive layer, the second conductive layer having a resistance higher than a resistance of the first conductive layer;
    forming a pixel electrode, the pixel electrode being electrically insulated from the auxiliary electrode;
    forming a first intermediate layer on the pixel electrode and the auxiliary electrode, the first intermediate layer comprising an organic material;
    forming an emission layer corresponding to the pixel electrode on the first intermediate layer, wherein the first intermediate layer is interposed between the pixel electrode and the emission layer;
    exposing the first conductive layer by forming a first opening in the first intermediate layer and an opening portion in the second conductive layer by removing a portion of the first intermediate layer and a portion of the second conductive layer of the auxiliary electrode; and
    forming an opposite electrode on the first intermediate layer and the first conductive layer, wherein the opposite electrode is disposed contacting the first conductive layer exposed through the first opening of the first intermediate layer and the opening portion of the second conductive layer,
    wherein a width of the first opening in the first intermediate layer is larger than a width of the opening portion in the second conductive layer.

2. The method of claim 1, wherein the exposing of the first conductive layer comprises radiating a laser beam onto the first intermediate layer to form the first opening and the opening portion.

3. The method of claim 1, wherein the forming of the auxiliary electrode further comprises forming a third conductive layer under the first conductive layer, the third conductive layer having a resistance higher than the resistance of the first conductive layer.

4. The method of claim 3, wherein the second conductive layer and the third conductive layer comprise same materials.

5. The method of claim 4, wherein the second conductive layer and the third conductive layer comprise a light-transmissive conductive material.

6. The method of claim 1, wherein the forming of the pixel electrode comprises forming the pixel electrode and the auxiliary electrode simultaneously on a same layer having a same layered structure.

7. The method of claim 1, further comprising:
    forming an auxiliary opposite electrode corresponding to the auxiliary electrode and the pixel electrode,
    wherein the exposing of the first conductive layer further comprises forming a third opening in the auxiliary opposite electrode corresponding to the first opening and the opening portion, and
    wherein the first intermediate layer is disposed on the auxiliary electrode and the pixel electrode,
    wherein the opposite electrode is disposed contacting the first conductive layer exposed through the opening portion of the second conductive layer, the first opening of the first intermediate layer, and the third opening of the auxiliary opposite electrode.

8. The method of claim 7, wherein the exposing of the first conductive layer further comprises radiating a laser beam onto the auxiliary opposite electrode to form the first opening, the opening portion, and the third opening simultaneously.

9. The method of claim 7, wherein the opposite electrode is formed to be thicker than the auxiliary opposite electrode.

10. The method of claim 1, further comprising:
    forming a second intermediate layer covering the first intermediate layer and the emission layer,
    wherein the exposing of the first conductive layer further comprises forming a second opening in the second intermediate layer, the first opening in the first intermediate layer, and the opening portion in the second conductive layer,
    wherein the first intermediate layer is disposed on the auxiliary electrode and the pixel electrode, and
    wherein the opposite electrode is contacting the first conductive layer exposed through the opening portion of the second conductive layer, the first opening of the first intermediate layer, and the second opening of the second intermediate layer.

11. The method of claim 10, wherein the exposing of the first conductive layer comprises radiating a laser beam onto the second intermediate layer to form the first opening of the first intermediate layer, the second opening of the second intermediate layer, and the opening portion of the second conductive layer.

* * * * *